United States Patent
Wyville (10) Patent No.: US 9,065,425 B2
(45) Date of Patent: Jun. 23, 2015

(54) FEED-FORWARD LINEARIZATION WITHOUT PHASE SHIFTERS

(71) Applicant: Telefonaktiebolaget L M Ericsson (Publ), Stockholm (SE)

(72) Inventor: Mark William Wyville, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 346 days.

(21) Appl. No.: 13/851,721

(22) Filed: Mar. 27, 2013

(65) Prior Publication Data

US 2014/0280415 A1 Sep. 18, 2014

Related U.S. Application Data

(60) Provisional application No. 61/783,159, filed on Mar. 14, 2013.

(51) Int. Cl.
- G06F 17/10 (2006.01)
- H03H 17/02 (2006.01)
- H03H 15/00 (2006.01)
- H03H 17/06 (2006.01)

(52) U.S. Cl.
CPC ......... *H03H 17/0248* (2013.01); *H03H 15/023* (2013.01); *H03H 17/06* (2013.01)

(58) Field of Classification Search
None
See application file for complete search history.

(56) References Cited

U.S. PATENT DOCUMENTS

| 5,959,500 | A  | 9/1999 | Garrido |
| 6,734,731 | B2 | 5/2004 | Cavers et al. |
| 2004/0193669 | A1 | 9/2004 | Shirani |
| 2004/0247042 | A1 | 12/2004 | Sahlman |
| 2005/0036575 | A1 | 2/2005 | Kuchi et al. |
| 2005/0200408 | A1 | 9/2005 | Benjamin et al. |
| 2005/0226345 | A1 | 10/2005 | Klahn et al. |

(Continued)

FOREIGN PATENT DOCUMENTS

| EP | 2136469 A1 | 12/2009 |
| WO | 03079540 A2 | 9/2003 |
| WO | 2005033902 A2 | 4/2005 |
| WO | 2012094087 A1 | 7/2012 |

OTHER PUBLICATIONS

Anand Raghavan et al., "A Low Additive Noise Interference Canceller for High Sensitivity Applications" Georgia Electronic Design Center, School of ECE, Georgia Institute of Technology, Atlanta, GA 2Quellan Inc., 75 5th Street NW Suite 210, Atlanta, GA 30308, IEEE RWS Conference Proceedings, Jan. 2008. pp. 45-48.

(Continued)

*Primary Examiner* — David H Malzahn
(74) *Attorney, Agent, or Firm* — Christopher & Weisberg, P.A.

(57) ABSTRACT

A method and system for providing a finite impulse response, FIR, filter in a power amplification system are disclosed. An FIR filter includes a first signal path having a first delay, $\tau_1$. The first signal path is configured to receive an output from a power amplifier. A second signal path is in parallel with the first signal path has a second delay, $\tau_2$, and a first scalar multiplier, $\alpha_1$. A third signal path in parallel with the first and second signal paths has a third delay, $\tau_3$, and a second scalar multiplier, $\alpha_2$. The second and third signal paths are configured to receive a sum of the output of the power amplifier and a reference signal. Delays $\tau_1$, $\tau_2$, and $\tau_3$ are integer multiples of a period of time. An output is a sum of a signal from each of the first, second and third signal paths.

20 Claims, 7 Drawing Sheets

(56) References Cited

U.S. PATENT DOCUMENTS

2006/0209985 A1    9/2006  Kang
2011/0099213 A1*   4/2011  Snelgrove .................. 708/300
2014/0280415 A1*   9/2014  Wyville ..................... 708/300

(Continued)

OTHER PUBLICATIONS

A. M. Smith and J. K. Cavers, "A Wideband Archtiecture for Adaptive Feedforward Linearization," School of Engineering Science, Simon Fraser University, Burnaby, B.C., V5A 1S6 Canada, IEEE VTC, May 1998, pp. 2488-2492.

International Search Report and Written Opinion dated May 8, 2014 for International Application No. PCT/IB2014/058647, International Filing Date—Jan. 29, 2014 consisting of 10-pages.

Borth et al., "A Flexible Adaptive FIR Filter VLSI IC" XP000647194 IEEE Journal on Selected Areas in Communications, vol. 6(3), pp. 494-503, ISSN: 0733-8716, Digital Object Identifier: 10.1109/49.1917 Apr. 1988 consisting of 10-pages.

* cited by examiner

FEED-FORWARD LINEARIZATION WITHOUT PHASE SHIFTERS

CROSS-REFERENCE TO RELATED APPLICATION

This application is related to and claims priority to U.S. Provisional Patent Application Ser. No. 61/783,159, filed Mar. 14, 2013, entitled FEED-FORWARD LINEARIZATION WITHOUT PHASE SHIFTERS, the entirety of which is incorporated herein by reference.

TECHNICAL FIELD

The present invention relates to feed forward (FF) linearization in a power amplifier.

BACKGROUND

Power amplifiers are used in a variety of systems including wireless communication systems such as Long Term Evolution (LTE) systems. For example, a base station such as an evolved node B (eNB) has power amplifiers to amplify and transmit a signal on an RF carrier to one or more mobile devices in a region served by the base station. Conversely, a mobile device has a power amplifier to amplify and transmit a signal on an RF carrier to the base station.

Figure 1:
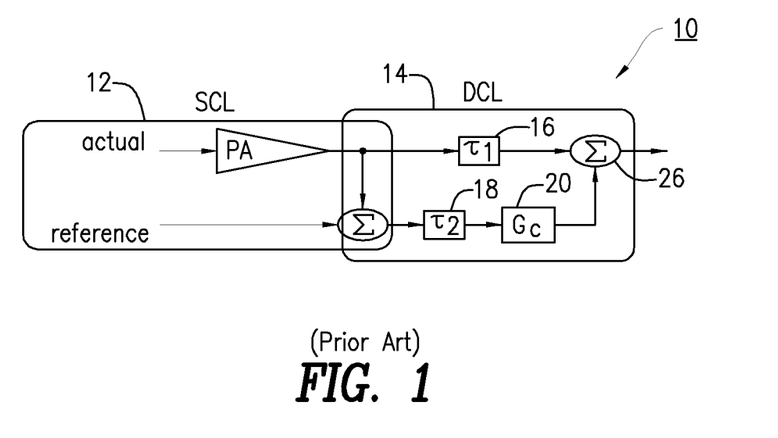
FIG. 1 is a block diagram of a known power amplifier linearization system.
Figure 2:
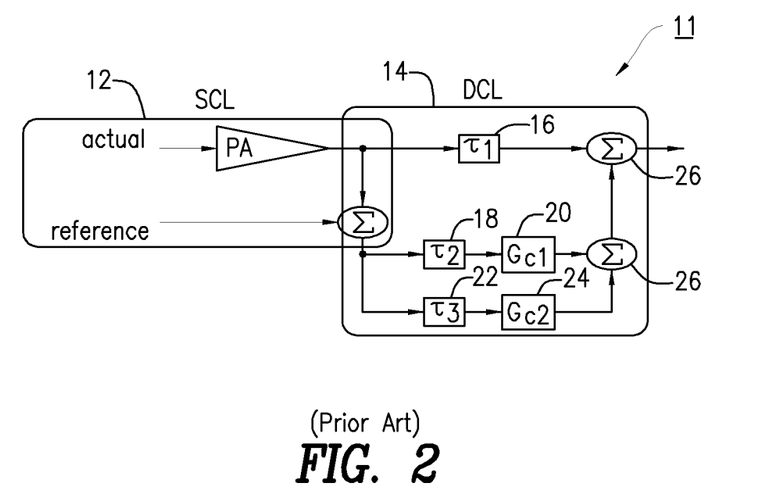
FIG. 2 is a block diagram of an alternative known power amplifier linearization system.

Such power amplifiers are typically operated in a non-linear region to achieve high efficiency. Feed forward (FF) power amplifier linearization is a technique that reduces the output distortion of a non-linear power amplifier (PA). A typical FF power amplifier linearization system is shown in FIG. 1. The power amplifier system 10 has two FF cancellation loops: the signal cancellation loop (SCL) 12 and the distortion cancellation loop (DCL) 14. Details of the SCL 12 are not shown in the figure. The DCL 14 includes at least 1 main path and 1 FF path with independent delays 16 and 18. In one of the paths is an adjustable complex gain 20. Successful operation of the SCL 12 prevents the components of the DCL 14 from being pushed into non-linear operation, and prevents the DCL 14 from cancelling the desired signal to be amplified. Successful operation of the DCL 14 linearizes the PA 10 output signal. FIG. 2 shows a typical power amplifier system 11, having an additional FF path in the cancellation loop 14. The additional path includes a delay 22 and a complex gain 24.

Figure 3:
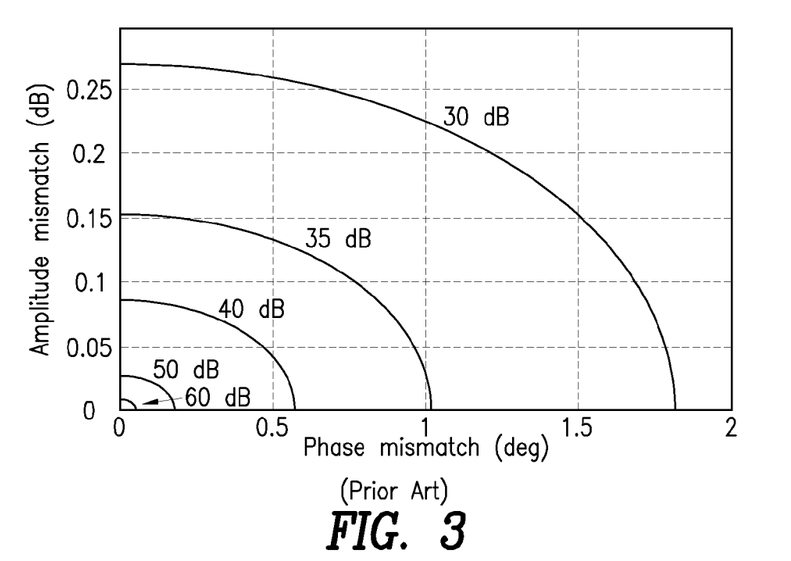
FIG. 3 is a graph of a relationship between phase mismatch and amplitude mismatch.
Figure 4:
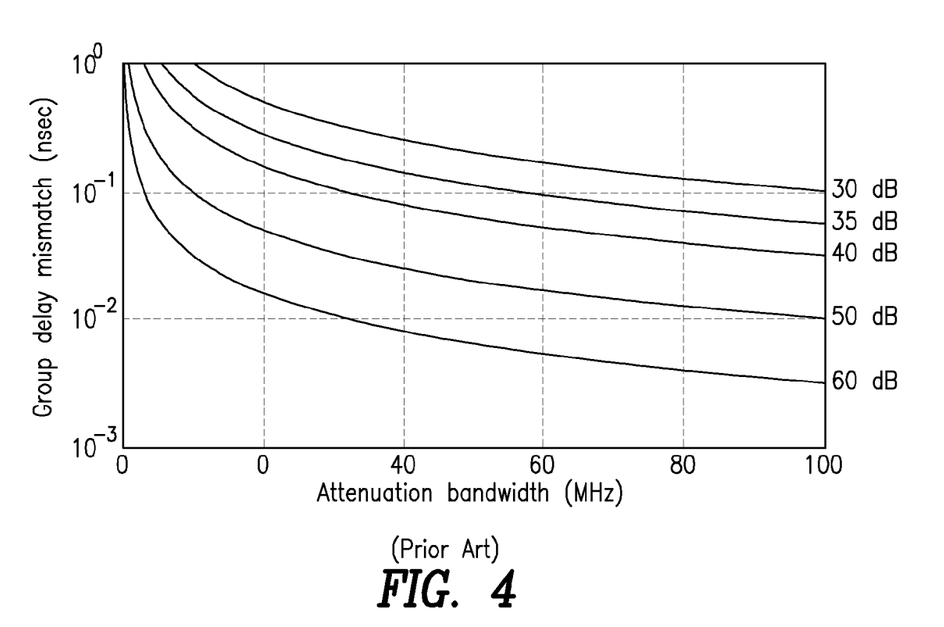
FIG. 4 is a graph of a relationship between attenuation bandwidth and group delay mismatch.

The primary performance metrics of the FF cancellation loops 12 and 14 are attenuation level and attenuation bandwidth. The attenuation level is very sensitive to phase and amplitude between the FF paths in the DCL 14. The relationship between phase mismatch and amplitude mismatch is shown in FIG. 3. Adaptive algorithms may be needed to maintain adequate attenuation during environmental changes and component drift. FIG. 4 shows that the attenuation bandwidth is limited by group delay mismatch between the FF paths and by frequency dependent components.

The attenuation bandwidth of the conventional FF amplifier linearizer, DCL 14, can be increased by adding more FF paths in the cancellation look. Each path generally has a different delay element. The outputs of the paths are summed by summers 26. Complex gain adjusters 20 and 24 are used within the FF loops to adjust the magnitude and phase of the signal. In a radio frequency, RF, power amplifier, the signal to be adjusted is at a radio frequency.

The complex gain components 20 and 24 can be realized with a variable gain component, such as a variable gain amplifier, VGA, or voltage variable attenuator, WA, cascaded with a variable phase shifter. Alternatively, the functionality of a complex gain element can be realized with a vector modulator, also known as a vector attenuator. The first function block in a vector modulator splits the input signal into two paths with the two paths differing in phase ideally by 90 degrees. The paths are independently adjusted in magnitude and are then recombined. These approaches to complex gain implementation require frequency independent phase shifters. However, a constant phase shift over a wide frequency band is difficult to realize. Another implementation of the vector modulator involves two paths differing in delay in order to realize the 90 degree phase shift function at some specific frequency. However, this implementation is inherently narrow band.

SUMMARY

The present invention advantageously provides a method and devices for finite impulse response filter, FIR, implementation in a power amplification system. According to one aspect, an FIR filter includes a first signal path having a first delay. The first signal path is configured to receive an output from a power amplifier. A second signal path in parallel with the first signal path has a second delay, and a first scalar multiplier, $\alpha_1$. A third signal path in parallel with the first and second signal paths has a third delay, and a second scalar multiplier, $\alpha_2$. The second and third signal paths are configured to receive a sum of the output of the power amplifier and a reference signal. The first, second and third delays are integer multiples of a period of time. An output that is a sum of a signal from each of the first, second and third signal paths is provided.

According to this aspect, the first and second scalar multipliers are chosen to position roots of a z-domain impulse response of the FIR filter to have a selected frequency response of the FIR filter. In some embodiments, a difference in delay, $\Delta\tau = \tau_2 - \tau_1 = \tau_3 - \tau_2$, is chosen to be equal to $$\Delta\tau = \frac{2m-1}{2f_c},$$

where m is an integer greater than zero, and $f_c$ is a center frequency of operation of the FIR filter, and where $\tau_1$, $\tau_2$ and $\tau_3$ are the first, second and third delays, respectively. In some embodiments, the FIR filter has a z-domain impulse response proportional to $H(z)=1+\alpha_1 z^{-1}+\alpha_2 z^{-2}$, where the scalar multipliers are chosen to adjust the roots of the z-domain impulse response to have the selected frequency response of the FIR filter. In these embodiments, $\alpha_1$ may be chosen so that roots of the z-domain impulse response are substantially positioned at $z=-1$. The scalar multipliers may be chosen to constrain the roots to be substantially positioned on a unit circle. More particularly, $\alpha_2$ may be chosen equal to 1 and $\alpha_1$ may be chosen between 0 and +2. In some embodiments, the FIR filter has a z-domain impulse response proportional to $H(z)=\alpha_1+1\cdot z^{-1}+\alpha_2 z^{-2}$, where the scalar multipliers are chosen to adjust the roots of the z-domain impulse response to have a selected frequency response of the FIR filter. In these embodiments, $\alpha_2$ may be chosen equal to $\alpha_1$ and the value of $\alpha_1$ may be chosen to be greater than ½.

According to another aspect, the invention provides a method of designing an FIR filter for use in a power amplifier. The method includes choosing a center frequency of operation of the FIR filter. A delay difference $\Delta\tau$ between paths of the FIR filter is chosen equal to $$\Delta \tau = \frac{2m-1}{2f_c},$$

where m is an integer greater than zero, and $f_c$ is the center frequency of operation of the FIR filter. A path of the FIR filter is chosen to have a least time delay, so that the FIR filter has a z-domain impulse response being proportional to one of $H(z)=1+\alpha_1 z^{-1}+\alpha_2 z^{-2}$ and $H(z)=\alpha_1+1\cdot z^{-1}+\alpha_2 z^{-2}$. Scalar multipliers in two of three paths of the FIR filter are adjusted to adjust roots of the z-domain impulse response to have a selected frequency response.

According to this aspect, in some embodiments, the path having the least time delay is a path not having a scalar multiplier. In some embodiments, the path having the least time is a path having one of the scalar multipliers. In some embodiments, an insertion loss of the FIR filter is a function of which path is chosen to have the least time delay. In some embodiments, an attenuation of the FIR filter is a function of which path is chosen to have the least time delay. In some embodiments, the scalar multipliers are chosen adaptively based on a desired frequency response of the FIR filter.

According to yet another aspect, the invention provides a power amplification system. The power amplification system has a power amplifier having an output and an FIR filter. The FIR filter has a main path that has a first time delay and a main path output. The FIR filter also has a second path having a second time delay, a first scalar multiplier, and a second path output. The FIR filter also has a third path having a third time delay, a second scalar multiplier and a third path output. The first, second and third time delays are integer multiples of a period of time. The FIR filter has a first input configured to receive the output of the power amplifier and to channel the output of the power amplifier to the main path of the FIR filter. The FIR filter also has a first adder configured to receive the output of the power amplifier and a reference signal, and to channel a sum of the output of the power amplifier and the reference signal to the second and third path of the FIR filter. A second adder is configured to sum the main path output with the second path output and the third path output.

According to this aspect, in some embodiments, the first time delay is less than the second time delay and is less than the third time delay. In some embodiments, the second time delay is less than the first time delay. In some embodiments, a delay difference $\Delta\tau$, between the first time delay and the second time delay is chosen to be equal to $$\Delta \tau = \frac{2m-1}{2f_c},$$

where m is an integer greater than zero, and $f_c$ is a center frequency of operation of the FIR filter. In these embodiments, m may be chosen equal to 1.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Before describing in detail exemplary embodiments that are in accordance with the present invention, it is noted that the embodiments reside primarily in combinations of apparatus components and processing steps related to feed forward linearization in a power amplifier. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

If the delay blocks 16, 18 and 22 in FIGS. 1 and 2 are all integer multiples of some period of time, then the DCLs 14 may have the same structure as a digital finite impulse response, FIR, filter, but at RF. Digital FIR filter design is based on discrete time analysis using the z-transform. Consider, for example, a single FF path with a frequency dependent complex gain as shown in FIG. 1. If the complex gain were instead a frequency independent real gain, then the DCL 14 may be designed as a real valued FIR filter with a discrete time step $\Delta\tau=\tau_2-\tau_1$, where $\tau_2>\tau_1$, and a complex conjugate pair of tunable transfer function zeros. The frequency response would have a period of $1/\Delta\tau$. Thus, the difference between the known DCL 14 of FIG. 1 and a real valued FIR filter is the frequency dependence of the complex gain 20.

Similarly, if both complex gains 20 and 24 of the DCL 14 were frequency independent real gains and the delay elements 16, 18 and 22 were integer multiples of a period of time, then the DCL 14 would have the structure of a real valued FIR filter with two complex conjugate pairs of tunable transfer function zeros, with a frequency response having a period $1/\Delta\tau$. If the difference $\tau_3-\tau_2$ is equal to $\tau_2-\tau_1$, then the two complex conjugate pairs of tunable zeros can be placed on the unit circle. The pair of zeros can be placed close to each other to result in a wider cancellation bandwidth than can be achieved with only one tunable zero. The pair of zeros can be centered at a specified frequency to center the cancellation band about the specified frequency.

Thus, embodiments of the present invention include RF FIR filters that use fixed delays between successive FF paths, with each path except the main path having a scalar, frequency independent, gain or attenuation. The delays between the paths are fixed such that the center frequency of a stop band of a filter is at some desired frequency near which the cancellation of the filter is desired. There is no phase shifting in the paths, so the bandwidth is not limited by phase shifting components. Additional FF paths can be added to increase the attenuation level and/or the attenuation bandwidth.

Figure 5:
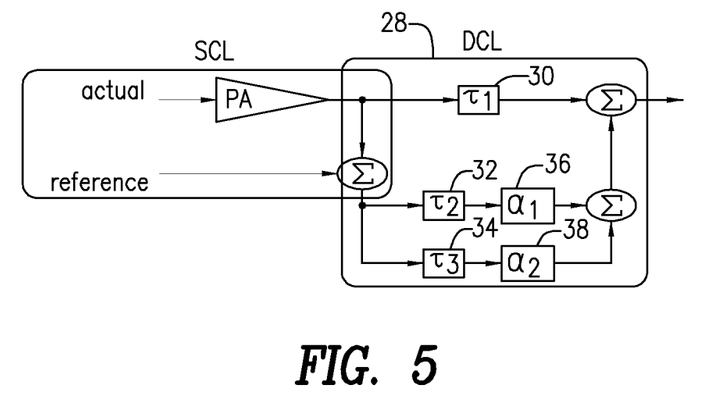
FIG. 5 is a block diagram of one embodiment of a distortion compensation loop, DCL, implemented as an RF FIR filter according to principles of the present invention.

FIG. 5 shows one embodiment of a DCL 28 implemented as a real valued FF FIR filter according to principles of the present invention. In the DCL 28, the time delays, $\tau_1$, $\tau_2$ and $\tau_3$ satisfy the constraint that the base time step $\Delta\tau=\tau_3-\tau_2=\tau_2-\tau_1$, and the gains $\alpha_1$ and $\alpha_2$ are frequency independent real scalar multipliers. The z-domain impulse response of the FIR filter 28 is given by:

$$H(z)=1+\alpha_1 z^{-1}+\alpha_2 z^{-2}$$

This impulse response has roots which correspond to transfer function zeros at:

$$z_r = -\frac{\alpha_1}{2} \pm \sqrt{\left(\frac{\alpha_1}{2}\right)^2 - \alpha_2}$$

For the transfer function zeros to lie on the unit circle, the following two conditions must be satisfied.

$$|\alpha_1|<2, \text{ and } \alpha_2=1$$

Figure 6:
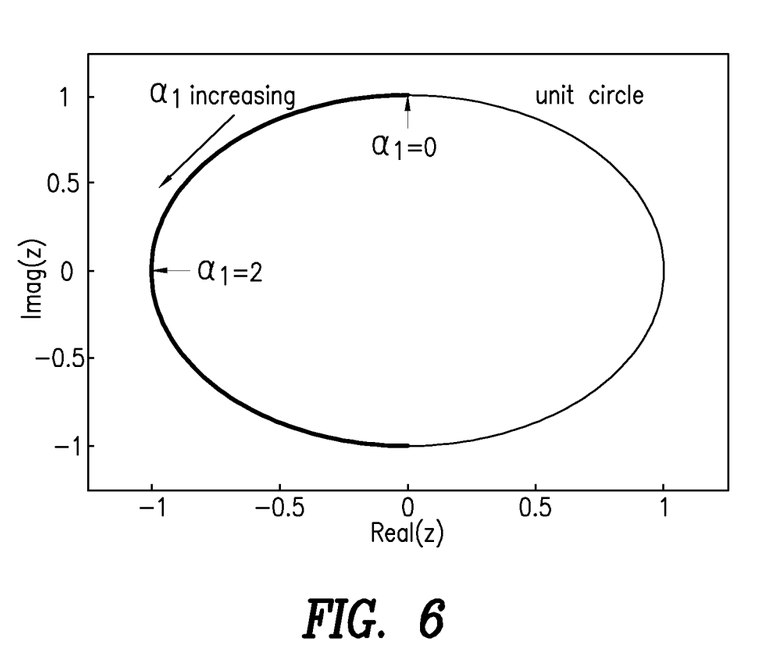
FIG. 6 is a diagram of zeros on the unit circle in the z-domain corresponding to the FIR filter of FIG. 5.

FIG. 6 shows a unit circle in the z domain and the possible positions of zeros on the left half of the unit circle for different values of $\alpha_1$. By holding $\alpha_2=1$ and varying $\alpha_1$ from 0 to +2, a zero can be placed anywhere on the left half of the unit circle in the z-domain, and the complex conjugate zero will also lie on the unit circle, as shown in FIG. 6.

Figures 7, 8:
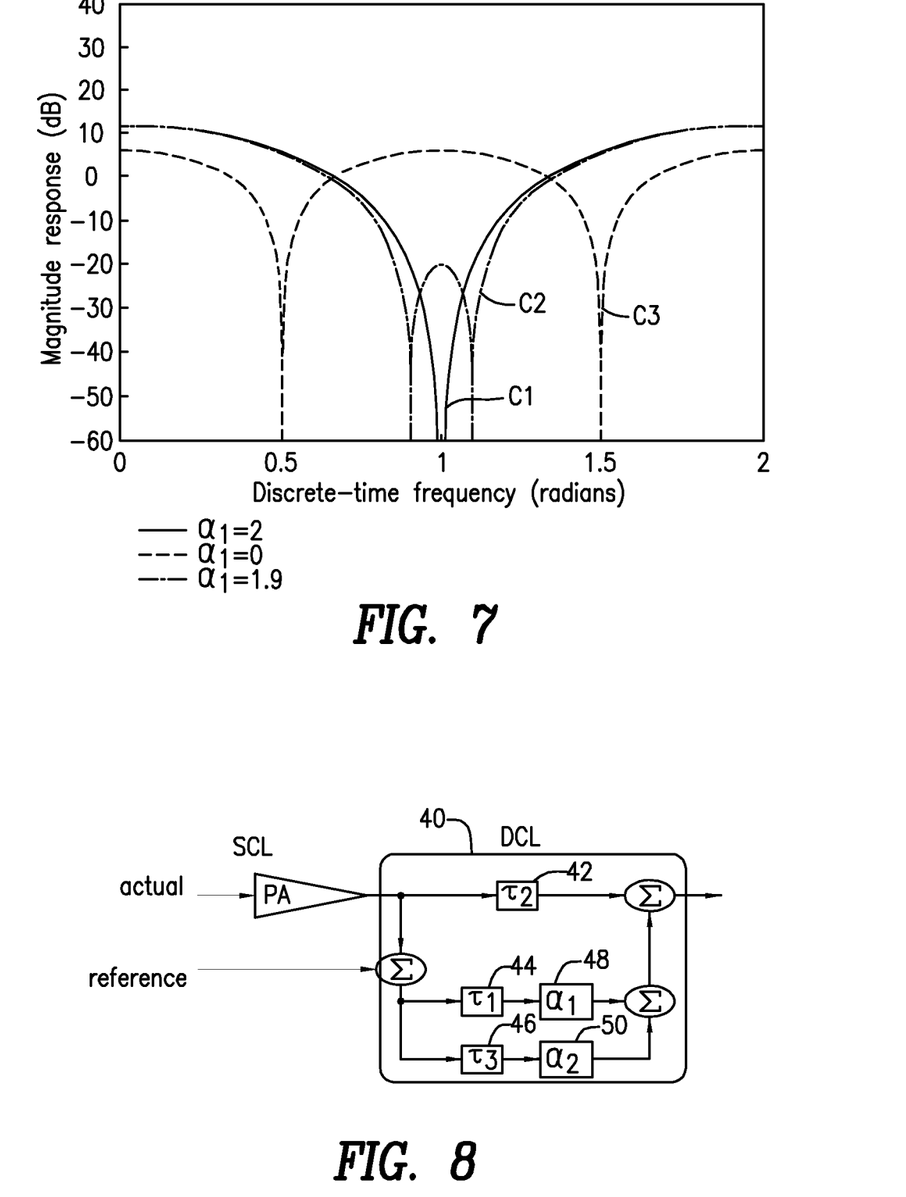
FIG. 7 is a graph of frequency responses of the FIR filter of FIG. 5 for different values of $\alpha_1$.
FIG. 8 is a block diagram of an alternative FIR filter according to principles of the present invention.

FIG. 7 is a graph of frequency responses of the circuit of FIG. 5 for 3 different values of $\alpha_1$. The frequency responses correspond to different values of $\alpha_1$, corresponding to different placements of the transfer function zeros on the unit circle. When the complex conjugate pair of zeros are relatively close to each other in the z-domain, for example, near z=−1 corresponding to $\alpha_1=2$, then the frequency response, as shown in FIG. 7, exhibits a bandwidth that is larger than when the zeros are placed far apart, for example, near z=+/−j corresponding to $\alpha_1=0$.

As shown in FIG. 7, the optimum attenuation bandwidth may not be realized when $\alpha_1=2$, exactly, as in curve C1. Rather, the optimum attenuation bandwidth may be achieved with $\alpha_1=1.9$, as in curve C2, where some attenuation performance at the center frequency is sacrificed to achieve wider bandwidth of attenuation. The attenuation bandwidth may be least desirable when $\alpha_1=0$, in curve C3. Thus, as shown in FIG. 7, operation in a manner such that the conjugate pair of zeros are near to z=−1 is desirable. In order to achieve this, the following relationship between the center frequency $f_c$ of the attenuation bandwidth and the discrete time step $\Delta\tau$ must hold.

$$\Delta\tau = \frac{2m-1}{2f_c},$$

with $m = 1, 2, 3 \ldots$

The value of m that results in maximum attenuation bandwidth is m=1. Other values of m are useful when it is not possible to realize the small step size that results from m=1, where the step size is the time delay difference between adjacent feed forward paths.

Note that only two FF paths with tunable components are shown in FIG. 5. Additional paths may be added, with each additional pair of paths providing an additional pair of tunable complex conjugate zeros. A single path could be added to obtain a single real zero on the imaginary z=0 axis. Adding zeros can improve the attenuation bandwidth of the frequency response of the circuit of FIG. 5.

FIG. 8 is a block diagram of an alternative embodiment of a DCL 40 implemented as an FIR filter. In contrast to the embodiment of FIG. 5, in the embodiment of FIG. 8, the main path no longer has the shortest delay. Rather, the shortest delay $\tau_1$ occurs in one of the FF paths. Thus, the delays of the FF paths straddle the delay of the main path such that the discrete time step size is $\Delta\tau=\tau_2-\tau_1=\tau_3-\tau_2$. This results in an alternative frequency response than that shown for the circuit of FIG. 5 in FIG. 7. In this case, the z-domain impulse response is:

$$H(z)=\alpha_1+1\cdot z^{-1}+\alpha_2 z^{-2}$$

Which has roots corresponding to transfer function zeros at:

$$z_r = -\frac{1}{2\alpha_1} \pm \frac{1}{2\alpha_1}\sqrt{1-4\alpha_1\alpha_2}$$

The following two conditions must be satisfied for the zeros to lie on the unit circle:

$$|\alpha_1|>\frac{1}{2}, \text{ and } \alpha_2=\alpha_1$$

Figure 9:
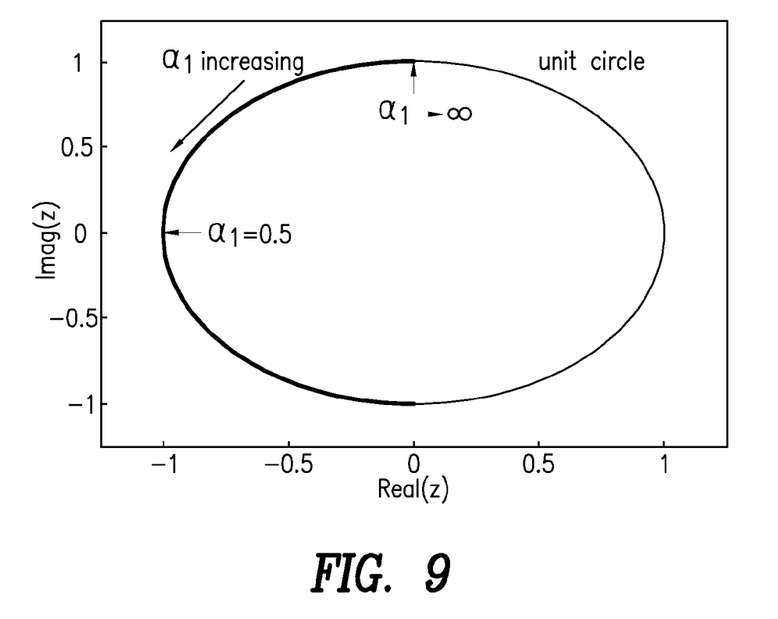
FIG. 9 is a diagram of zeros on the unit circle in the z-domain corresponding to the FIR filter of FIG. 8.
Figure 10:
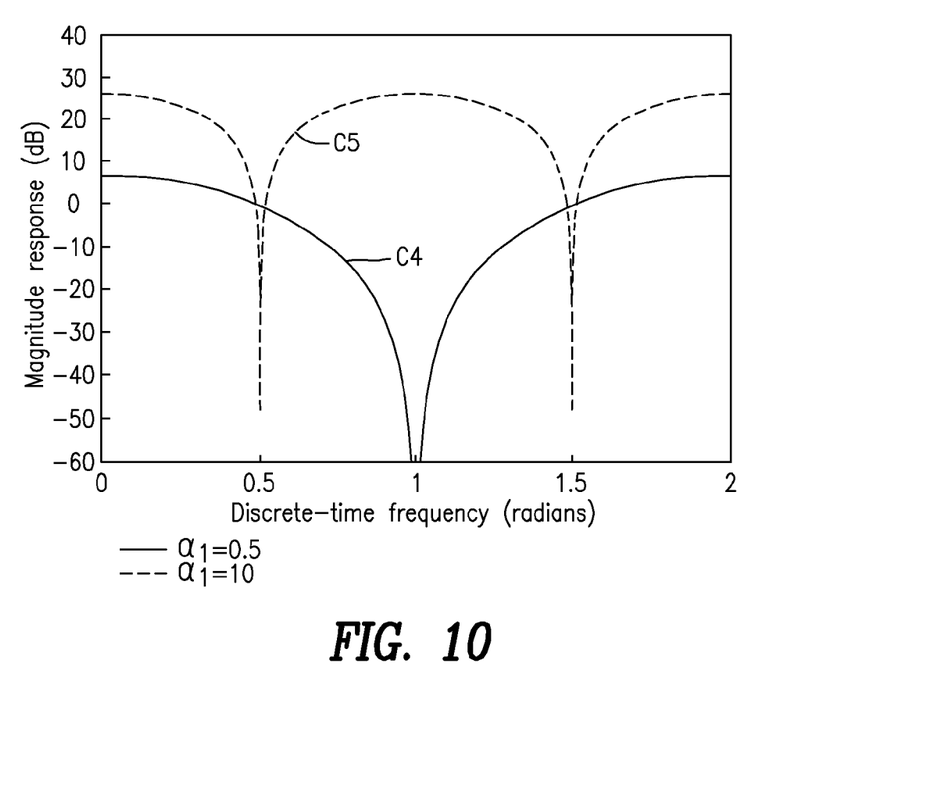
FIG. 10 is a graph of frequency responses of the FIR filter of FIG. 8 for different values of $\alpha$.

FIG. 9 shows a unit circle in the z domain and the possible positions of zeros on the left half of the unit circle for different values of $\alpha_1$. By varying $\alpha_1$ from ½ to ∞, and by holding $\alpha_2=\alpha_1$, a zero can be placed anywhere on the left half of the unit circle, and the corresponding complex conjugate zero will also lie on the unit circle. This is shown in FIG. 9, where a zero at z=−1 can be achieved with $\alpha_1=½$. When the complex conjugate zeros are relatively close to each other in the z-domain near z=−1, the result is a notch bandwidth that is larger than when the complex conjugate zeros are relatively far apart near z=+/−j, corresponding to $\alpha_1=∞$. FIG. 10 is a graph of frequency responses of the circuit of FIG. 8 for two different values of $\alpha_1$. In FIG. 10, curve C4 corresponds to $\alpha_1=½$ and curve C5 corresponds to $\alpha_1=10$. Note that the maximum of the magnitude response significantly increases as $\alpha_1$ increases.

Thus, as shown in FIG. 10, operation in a manner such that the conjugate pair of zeros are near to z=−1 is desirable. In order to achieve this, the following relationship between the center frequency $f_c$ of the attenuation bandwidth and the discrete time step $\Delta\tau$ must hold.

$$\Delta\tau = \frac{2m-1}{2f_c},$$

with $m = 1, 2, 3 \ldots$

The value of m that results in maximum attenuation bandwidth is m=1. Other values of m are useful when it is not possible to realize the small step size that results from m=1, where the step size is the time delay difference between adjacent feed forward paths.

Note that in FF amplifier linearization, a first directional coupler may be used to couple a portion of the signal from the output of the power amplifier into the FF paths containing the tunable elements, α. The signal from the FF paths may also be coupled back into the main path using a second directional coupler. Directional couplers are typically constructed using resonant sections that result in a nominal 90 degrees phase shift from the input port to the coupled port. The second directional coupler nominally contributes a −90 degrees phase shift from the coupled port back to the main path. If the first and second directional couplers are identical, a phase error in the first directional coupler may be compensated by the second directional coupler to provide a net phase change of zero. This is not true for amplitude attenuation by the couplers, and is not true if the couplers are not identical. Thus, the frequency response of the directional couplers might limit the frequency response of the FF FIR 28, 40. The frequency response might also be limited by fixed components added to the FF paths, such as an amplifier providing fixed gain. The effect of phase and amplitude errors from these additional components can be understood with reference to FIGS. 3 and 4.

Figure 11:
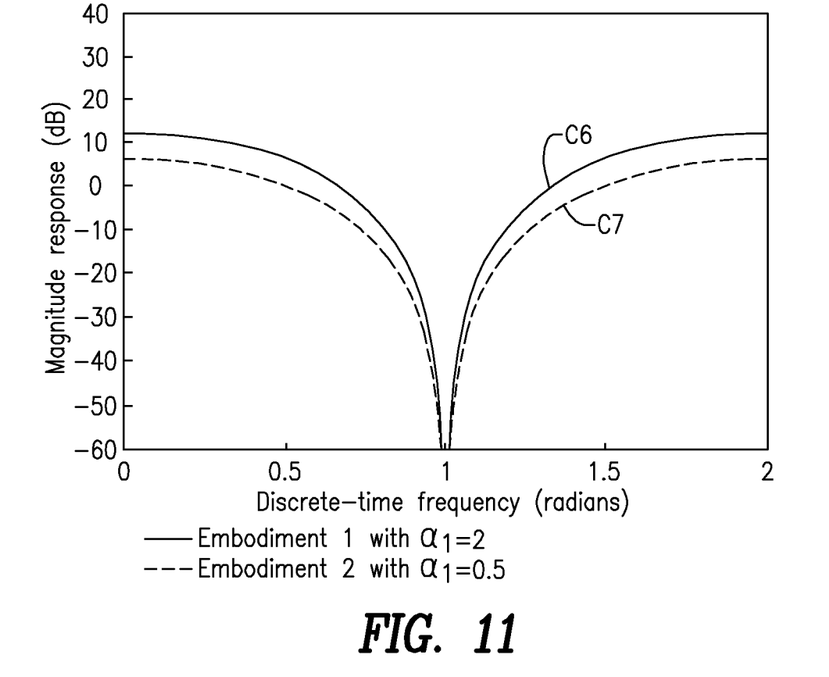
FIG. 11 is a graph of frequency responses for the FIR filters of FIGS. 5 and 8.

FIG. 11 is a graph of the magnitude responses of the embodiments of FIG. 5, curve C6, and FIG. 8, curve C7, where the tunable elements α are tuned to achieve maximum bandwidth attenuation. The two curves are vertically offset from each other by 6 decibels, dB. Note that the component gain values of the embodiment of FIG. 5 are larger than for the embodiment of FIG. 8. This results in 6 dB better cancellation performance by the embodiment of FIG. 8. Note however that in the embodiment of FIG. 5 the main RF path that is carrying the high power output signal has the least amount of delay. As this delay becomes smaller the insertion loss decreases. Note further that in the embodiment of FIG. 8, the magnitude responses of the two FF paths should be matched. It may be easier to match the magnitude responses of the two FF paths over some frequency range rather than to try to match magnitude response of one FF path to the delay line magnitude response of the main path of the embodiment of FIG. 5, because of the similar structure of the components in the two FF paths that is not present in the main path.

Figure 12:
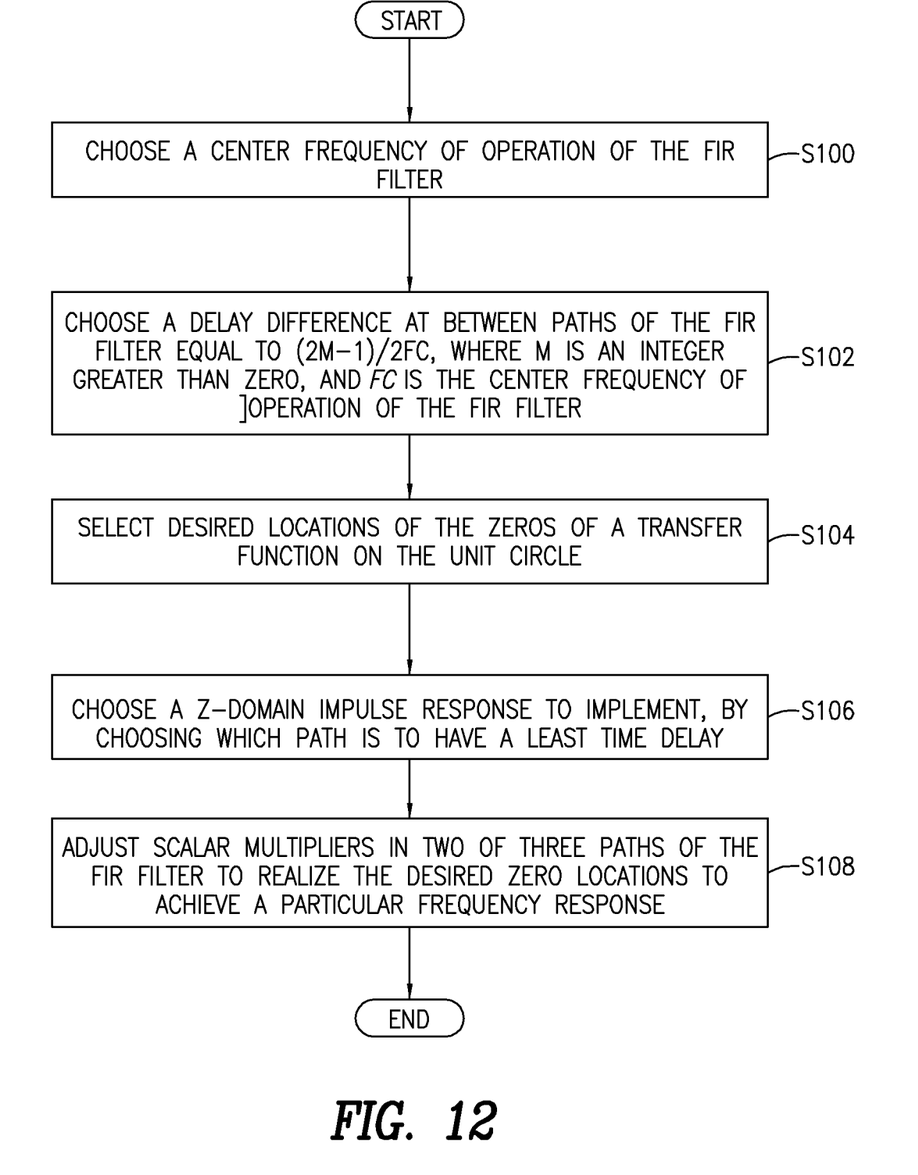
FIG. 12 is a flowchart of an exemplary process for designing an FIR filter for use in a power amplification system.

FIG. 12 is a flowchart of an exemplary process for designing an FIR filter for use in a power amplifier DCL or SCL. A center frequency, $f_c$, of operation of the FIR filter is chosen (block S100). Then, a delay difference Δτ between paths is chosen according to:

$$\Delta \tau = \frac{2m-1}{2f_c},$$
$$m = 1, 2, 3$$

(block S102). For maximum attenuation bandwidth, m=1. For larger step size, m is chosen greater than 1, which results in a larger value of Δτ. Desired locations of zeros of a transfer function on the unit circle in the z-domain are selected (block S104). For maximum attenuation bandwidth, the zeros should be near z=−1. A z-domain transfer function to be implemented is chosen by choosing which path in the FIR filter is to have a least time delay (block S106). The choice may be based on desired attenuation bandwidth versus main path delay. For minimum delay in the main path, which corresponds to minimum insertion loss in the main path, the embodiment of FIG. 5 may be chosen. For an additional 6 dB of attenuation, the embodiment of FIG. 8 may be chosen. Values for the frequency independent gains α are selected to realize the desired zero locations (block S108). In some embodiments, feedback from the output of the DCL may be used to choose the values of a.

Cancellation bandwidth improves as the time delays τ and real gains α become more frequency independent. Conversely, known DCLs such as described with reference to FIGS. 1 and 2, are limited by the frequency dependence of phase shifts in the FF paths. In contrast, in embodiments described herein, performance depends on frequency independence of time delays and real gains, which is easier to achieve than frequency independence of phase shifts.

Figure 13:
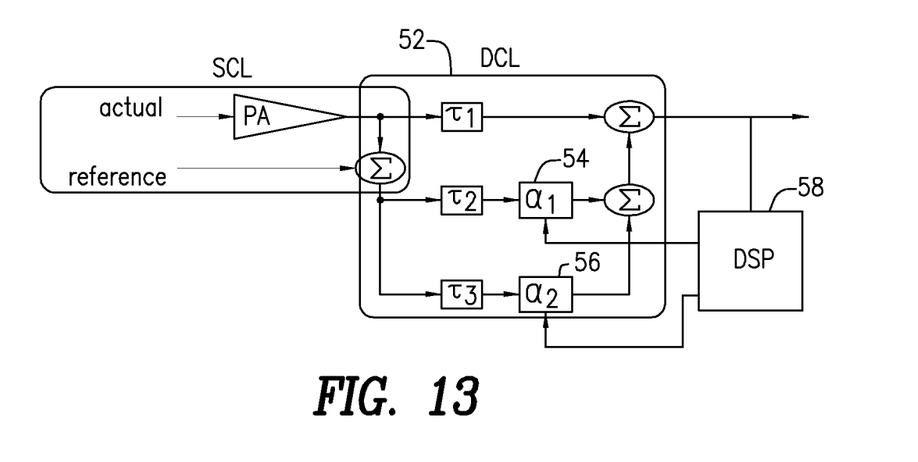
FIG. 13 is a block diagram of an FIR filter that employs feedback to adjust scalar gain components of the FIR filter according to principles of the present invention.

Note that the choice of tunable scalar components, α, has been shown to be based on the desired locations of the complex conjugate pairs of zeros. However, a feedback system may be constructed that adaptively adjusts the tunable scalar components to maximize the attenuation across a desired attenuation bandwidth. For example, the feedback may be based on the distortion power at the output of the FF FIR 28, 40. This is shown in FIG. 13, where an FIR filter 52 has two tunable scalar components 54 and 56 that are in communication with and tunable by a digital signal processor 58 based on the output of the FIR filter 52. For example, the digital signal processor 58 may compare the output of the FIR filter 52 to a desired response, and adaptively adjust the tunable scalar components 54 and 56 to minimize the error between the output of the FIR filter 52 and the desired response. Note further, that although the FF FIR 28, 40 was implemented in the DCL, the FF FIR filter may also, or instead, be implemented in the SCL 12.

The embodiments of FIGS. 5, 8 and 13 may be implemented in hardware or a combination of hardware and software. For example, the FF FIR filter of these embodiments may be implemented as application specific circuits, digital delay devices, multipliers, and adders, or by a general purpose digital signal processor, or other micro-processor operating under the direction of software stored in memory. In the embodiment of FIG. 13, the functions of the DSP 58 and the DCL 52 may be merged into one single digital signal processor.

Feed forward power amplifier linearization, as described herein, may be used to reduce output distortion of a non-linear power amplifier used in a wireless communication system such as an LTE communication system where a linear wideband response is desired to achieve high efficiency. Thus, the methods described herein may be applied to a power amplifier in a base station of a cellular radio network, an access point of a WiFi network, and in a mobile device served by a wireless network.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A finite impulse response, FIR, filter for a power amplification system, the FIR filter comprising:
    a first signal path having a first delay, the first signal path configured to receive an output from a power amplifier;
    a second signal path in parallel with the first signal path, the second signal path having a second delay, and a first scalar multiplier, $\alpha_1$;
    a third signal path in parallel with the first and second signal paths, the third signal path having a third delay, and a second scalar multiplier, $\alpha_2$, the second and third signal paths configured to receive a sum of the output of the power amplifier and a reference signal, the first, second and third delays being integer multiples of a period of time; and
    an output that is a sum of a signal from each of the first, second and third signal paths.

2. The FIR filter of claim 1, wherein the first and second scalar multipliers are chosen to position roots of a z-domain impulse response of the FIR filter to have a selected frequency response of the FIR filter.

3. The FIR filter of claim 2, wherein, a difference in delay, $\Delta\tau=\tau_2-\tau_1=\tau_3-\tau_2$, is chosen to be equal to $$\Delta\tau = \frac{2m-1}{2f_c},$$

where m is an integer greater than zero, and $f_c$ is a center frequency of operation of the FIR filter, and where $\tau_1$, $\tau_2$ and $\tau_3$ are the first, second and third delays, respectively.

4. The FIR filter of claim 3, wherein $\alpha_2$ equals 1 and $\alpha_1$ is chosen between 0 and +2.

5. The FIR filter of claim 2, having a z-domain impulse response proportional to $H(z)=1+\alpha_1 z^{-1}+\alpha_2 z^{-2}$, where the scalar multipliers are chosen to adjust the roots of the z-domain impulse response to have the selected frequency response of the FIR filter.

6. The FIR filter of claim 5, wherein $\alpha_1$ is chosen so that roots of the z-domain impulse response are substantially positioned at z=−1.

7. The FIR filter of claim 5, wherein the scalar multipliers are chosen to constrain the roots to be substantially positioned on a unit circle.

8. The FIR filter of claim 1, having a z-domain impulse response proportional to $H(z)=\alpha_1+1 \cdot z^{-1}+\alpha_2 z^{-2}$, where the scalar multipliers are chosen to adjust the roots of the z-domain impulse response to have a selected frequency response of the FIR filter.

9. The FIR filter of claim 8, wherein $\alpha_2$ equals $\alpha_1$ and wherein the magnitude of $\alpha_1$ is chosen to be greater than ½.

10. A method of designing an FIR filter for use in a power amplifier, the method comprising:
    choosing a center frequency of operation of the FIR filter;
    choosing a delay difference $\Delta\tau$ between paths of the FIR filter equal to $$\Delta\tau = \frac{2m-1}{2f_c},$$

where m is an integer greater than zero, and $f_c$ is the center frequency of operation of the FIR filter;
    choose which path of the FIR filter is to have a least time delay, so that the FIR filter has a z-domain impulse response being proportional to one of $H(z)=1+\alpha_1 z^{-1}+\alpha_2 z^{-2}$ and $H(z)=\alpha_1+1 \cdot z^{-1}+\alpha_2 z^{-2}$; and
    adjusting scalar multipliers in two of three paths of the FIR filter to adjust roots of the z-domain impulse response to have a selected frequency response.

11. The method of claim 10, wherein the path having the least time delay is a path not having a scalar multiplier.

12. The method of claim 10, wherein the path having the least time is a path having one of the scalar multipliers.

13. The method of claim 10, wherein an insertion loss of the FIR filter is a function of which path is chosen to have the least time delay.

14. The method of claim 10, wherein an attenuation of the FIR filter is a function of which path is chosen to have the least time delay.

15. The method of claim 10, wherein the scalar multipliers are chosen adaptively based on a desired frequency response of the FIR filter.

16. A power amplification system, comprising:
    a power amplifier having an output;
    an FIR filter, the FIR filter having:
        a main path having a first time delay and a main path output;
        a second path having a second time delay, a first scalar multiplier, and a second path output;
        a third path having a third time delay, a second scalar multiplier and a third path output, the first, second and third time delays being integer multiples of a period of time;
        a first input configured to receive the output of the power amplifier and to channel the output of the power amplifier to the main path of the FIR filter;
        a first adder configured to receive the output of the power amplifier and a reference signal, and to channel a sum of the output of the power amplifier and the reference signal to the second and third path of the FIR filter;
        a second adder configured to sum the main path output with the second path output and the third path output.

17. The system of claim 16, wherein the first time delay is less than the second time delay and is less than the third time delay.

18. The system of claim 16, wherein the second time delay is less than the first time delay.

19. The system of claim 16, wherein a delay difference $\Delta\tau$, between the first time delay and the second time delay is chosen to be equal to $$\Delta\tau = \frac{2m-1}{2f_c},$$

where m is an integer greater than zero, and $f_c$ is a center frequency of operation of the FIR filter.

20. The system of claim 19, wherein m is equal to one.

* * * * *